United States Patent
Hoang et al.

(12) 
(10) Patent No.: US 6,639,842 B1
(45) Date of Patent: Oct. 28, 2003

(54) METHOD AND APPARATUS FOR PROGRAMMING NON-VOLATILE MEMORY CELLS

(75) Inventors: Loc B. Hoang, San Jose, CA (US); Hung Q. Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/147,959

(22) Filed: May 15, 2002

(51) Int. Cl.[7] ............................................. G11C 16/00
(52) U.S. Cl. ............................ 365/185.28; 365/185.02; 365/185.25
(58) Field of Search ....................... 365/185.28, 185.25, 365/203, 195, 185.02

(56) References Cited

U.S. PATENT DOCUMENTS

| | | | |
|---|---|---|---|
| 5,289,411 A | 2/1994 | Jeng et al. | 365/185.12 |
| 5,511,022 A | * 4/1996 | Yim et al. | 365/185.25 |
| 6,195,297 B1 | * 2/2001 | Sano | 365/185.25 |

* cited by examiner

*Primary Examiner*—Tan T. Nguyen
(74) *Attorney, Agent, or Firm*—Gray Cary Ware & Freidenrich LLP

(57) ABSTRACT

A method and apparatus are disclosed which counteract coupling effects during programming of non-volatile memory cells in an array of the type which includes bit lines, word lines, and source lines, and temporary storage circuits which can be set to supply a desired state for use in connection with operations involving designated non-volatile memory cells, wherein each of the temporary storage circuits communicates with different groupings of the non-volatile memory cells by way of associated word and source lines. The method and apparatus includes precharging unselected bit lines to a program inhibit level, at a rate which is selected to reduce coupling effects between the unselected bits lines and word lines or source lines, as a part of a programming operation, inhibiting the operation of the temporary storage circuits during a first portion of the precharging step, arranging the temporary storage circuits to be responsive to a minimum number of word lines associated with the selected sector during a period in which unselected bit lines are precharged, setting ones of the temporary storage circuits to desired states following the first portion of the precharging step, and thereafter programming selected non-volatile memory cells.

12 Claims, 6 Drawing Sheets

METHOD AND APPARATUS FOR PROGRAMMING NON-VOLATILE MEMORY CELLS

TECHNICAL FIELD

The present invention relates generally to non-volatile memory cell arrays and in particular to counteracting coupling effects during the operation of such arrays.

BACKGROUND ART

In a typical array of non-volatile memory cells, such as those disclosed in U.S. Pat. No. 5,289,411, signal carrying regions or conductors include word lines (WL), bit lines (BL), and source lines (SL), which run parallel and/or transverse to one another. Storage circuits are sometimes provided to communicate with ones of these lines to provide signals or voltage levels required during an operation of the device. For example, latches can be provided to communicate with the source lines to supply a high voltage level during a programming operation. The physical arrangement of the various signal-carrying regions of the device can result in coupling, capacitive or otherwise, of signals or noise from one region to another, even though such coupling is unintended. As is well known in the art, capacitive coupling between conductive regions is inversely proportional to the separation between the conductive regions, and directly proportional to the area of portion of the conductor regions opposite each other. Thus, as devices are scaled down and circuitry becomes more tightly packed, coupling effects will increase.

It has been found that such coupling can interfere with the proper operation of the device, for example, by causing voltages or signals to be induced or coupled onto unintended conductive regions or components of the device, which in turn can result in improper operation of the device and possibly outright device failure. As an example, the above mentioned latches can be accidentally set by the coupled or induced voltages or signals, thereby causing the device to malfunction. There is therefore a need to provide a non-volatile memory cell array and method for operating such array in which such unintended coupling and accidental setting of latches is counteracted.

SUMMARY OF THE INVENTION

The above and other problems and disadvantages of prior non-volatile memory array devices and methods of operation are overcome by the present invention of a method and apparatus for programming a non-volatile memory array of the type which includes a plurality of bit lines, a plurality of word lines, and a plurality of source lines, and a plurality of temporary storage circuits which can be set to supply a desired state for use in connection with operations involving designated non-volatile memory cells, wherein each of the plurality of temporary storage circuits communicates with a different one of a plurality of groupings of the non-volatile memory cells by way of associated word and source lines. In one embodiment of the present invention, the method comprises the steps of precharging unselected bit lines to a program inhibit level, as a part of a programming operation, inhibiting the operation of the plurality of temporary storage circuits during a first portion of the precharging step, and setting ones of the plurality of temporary storage circuits to desired states following the first portion of the precharging step. In a further embodiment of the method the temporary storage circuits are set to a program state in response to an enable signal, and the inhibiting step includes the steps of setting the source lines at a reference potential during an initial portion of the precharging step, and withholding the enable signal from the temporary storage circuits during the initial portion of the precharging step. The withholding step can include the step of applying a disable signal to the temporary storage circuits during the initial portion of the precharging step.

In another embodiment of the present invention the method comprises the steps of precharging unselected bit lines to a program inhibit level, at a rate which is selected to reduce coupling effects between the unselected bits lines and word lines or source lines, as a part of a programming operation, and programming selected non-volatile memory cells according to states set in the plurality of temporary storage circuits. The step of precharging the bit lines to a program inhibit level can include the step of adjusting the rate of the precharging so that the bit lines reach the program inhibit level in approximately a program initialize period.

In a further embodiment of the present invention, the method for programming comprises the steps of arranging each of the plurality of temporary storage circuits to be responsive to a minimum number of word lines associated with the selected sector during a period in which unselected bit lines are precharged, precharging unselected bit lines to a program inhibit level, as a part of a programming operation, and programming selected non-volatile memory cells. The method can include the step of arranging each of the plurality of temporary storage circuits to be responsive to only one word line of the associated selected sector during the period in which the unselected bit lines are precharged.

The apparatus of the present invention implements the methods of the present invention.

These and other features and advantages of the present invention will be more readily understood upon consideration of the following detailed disclosure of the invention and accompanying drawings.

DETAILED DESCRIPTION OF THE INVENTION

Figure 1:
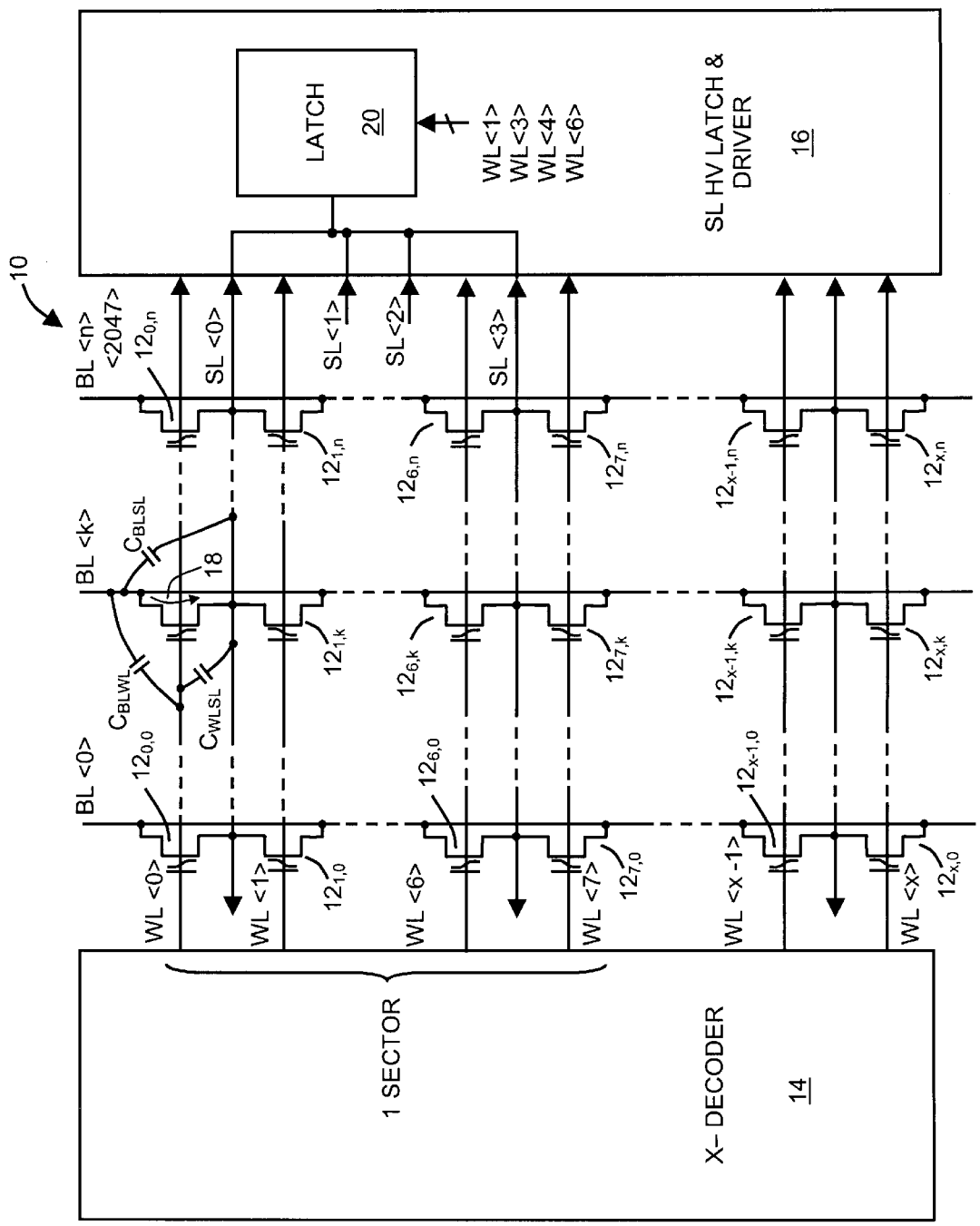
FIG. 1 is a simplified schematic of an array of non-volatile memory cells illustrating coupling mechanisms.
Figure 2:
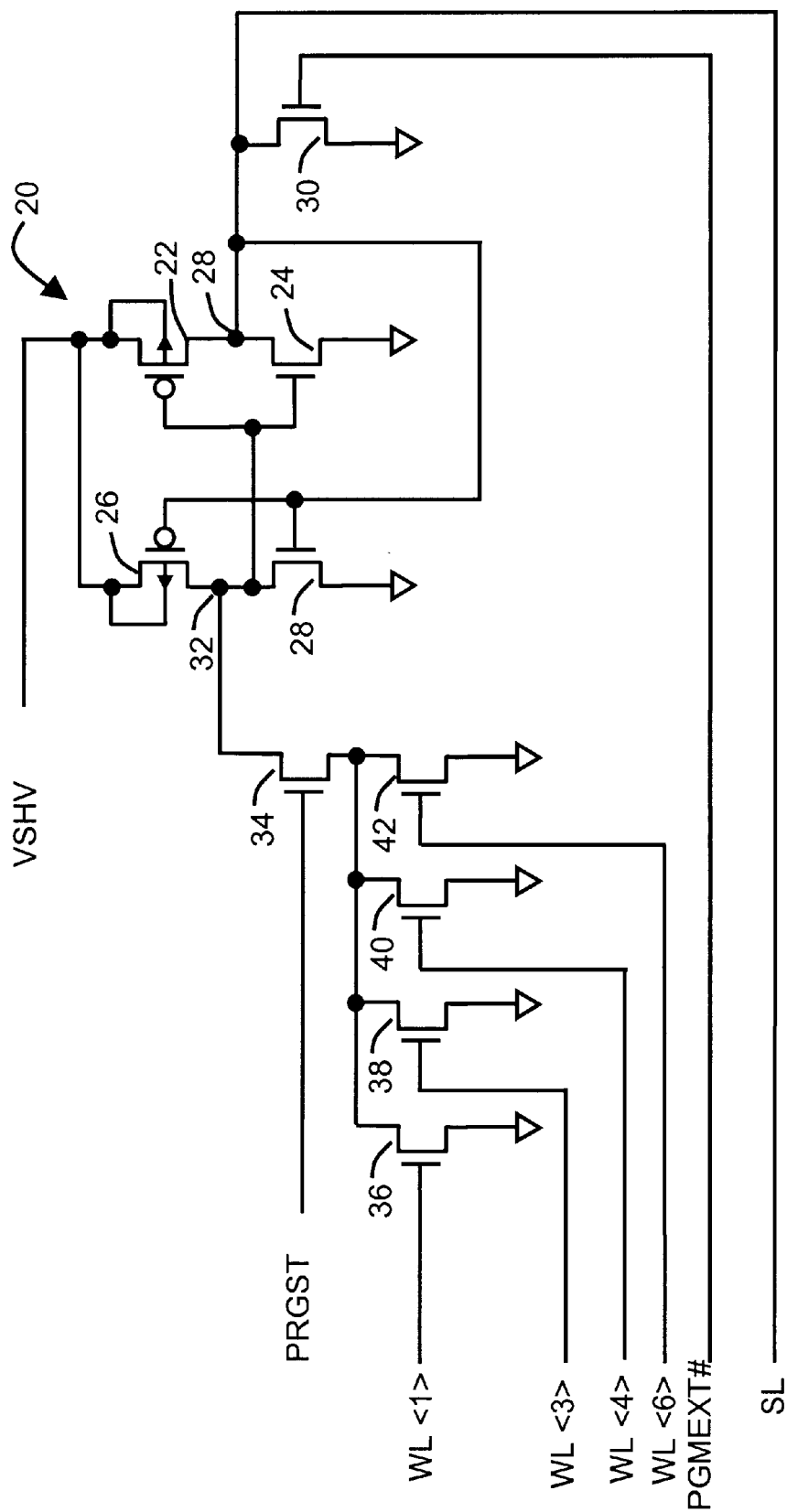
FIG. 2 is a simplified schematic diagram of a temporary storage circuit that can be used for implementing the source line high voltage latch and driver function indicated in FIG. 1.
Figure 3:
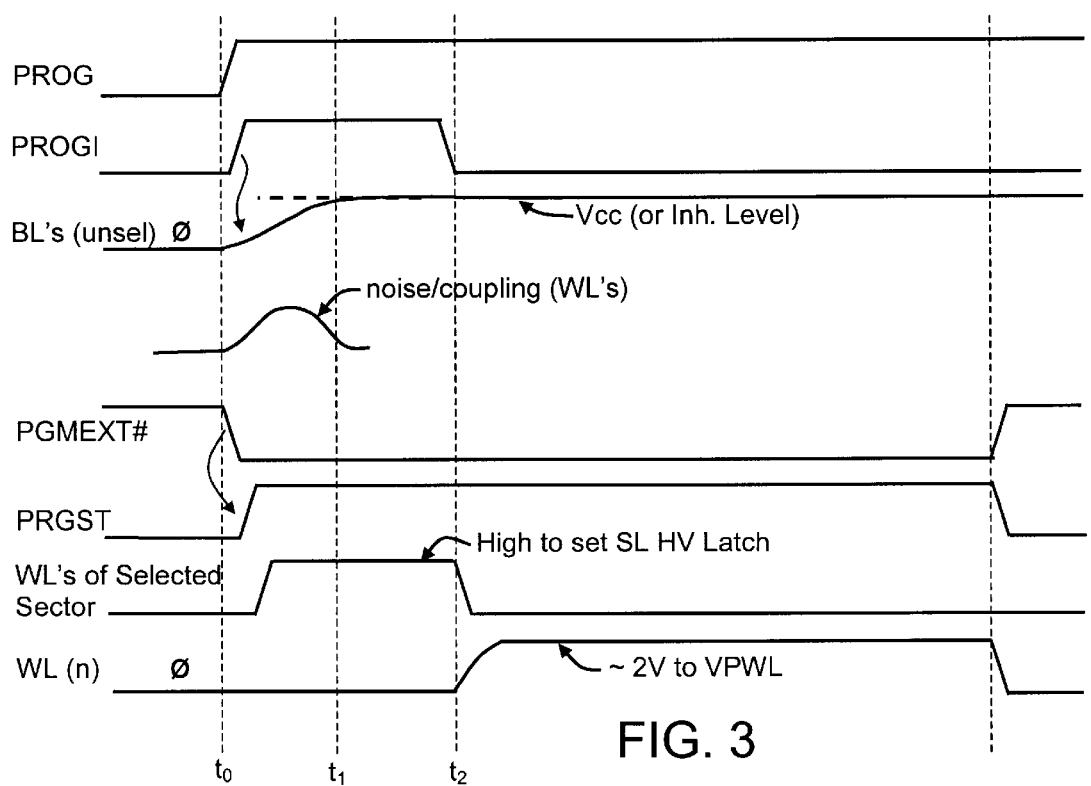
FIG. 3 is a timing diagram illustrating a programming operation of the non-volatile memory cells of FIG. 1 and the resulting noise/coupling effects on the word lines.

The effects of the above mentioned coupling will be better understood upon consideration of FIGS. 1 through 3. FIG. 1 is an example of an array 10 of non-volatile memory cells $12_{0,0}$ through $12_{x,n}$. In the embodiment shown, the non-volatile memory cells are arranged in rows, and the cells in each row share a common word line WL. The rows are paired together with the source terminals of non-volatile memory cells in each pair of rows being connected together to share a common source line (SL). Cells from each pair of rows are paired together and each pair of cells have their drains connected to an associated bit line BL. In FIG. 1, eight rows (four pairs of rows) form one sector.

For example, word line WL<0> is connected in common to the control gates of the non-volatile memory cells $12_{0,0}$, $12_{0,k}$ and $12_{0,n}$ in row 0; and word line WL<1> is connected in common to the control gates of the non-volatile memory cells $12_{1,0}$, $12_{1,k}$ and $12_{1,n}$ in row 1. The sources of the cells in rows 0 and 1 are connected to common source line SL<0>. Memory cells $12_{0,0}$ and $12_{1,0}$ are paired together and have their drains connected to bit line BL<0>; memory cells $12_{0,k}$ and $12_{1,k}$ are paired together and have their drains connected to bit line BL<k>; and memory cells $12_{0,n}$ and $12_{1,n}$ are paired together and have their drains connected to bit line BL<n>. As indicated in FIG. 1, "n" can be 2047, for example. Also in FIG. 1, rows 0 through 7 form a sector. Several sectors collectively form a block of non-volatile memory cells.

The X-decoder block 14 provides an address decoder function, and supplies signals on the word lines. The source line high voltage latch and driver ("SL HV Latch and Driver") block 16 provides a voltage for each source line SL. This voltage can be supplied by a temporary storage circuit, such as a latch, that can drive one or several source lines at a time. The latches are connected to receive signals from the word lines, and to supply a signal on the common source line (SL) for the rows. In the embodiment illustrated in FIG. 1, one latch 20 drives the shared source lines SL<0>, SL<1>, SL<2>, SL<3>, for the eight rows of cells in the sector. FIG. 2 is an example of a latch circuit 20 that can be used in connection with the array of FIG. 1. Using temporary storage circuits to provide signals on the common source lines is a simple way to control the application of operational signals (such as a high voltage for programming) to the array, and to control the loading effects of the array on the circuits used to generate the operational signals.

The latch 20 of FIG. 2 is formed by cross-coupling p-type and n-type transistor pairs, 22, 24 and 26, 28. Programming voltage VSHV is applied to the junction between p-type transistors 22 and 26. The sources of n-type transistors 24 and 28 are connected to a reference potential. The junction 28 between p-type transistor 22 and n-type transistor 24 is connected to the associated source line(s) SL, and also to the drain of n-type transistor 30. Junction 28 is also connected to the gates of p-type transistor 26 and n-type transistor 28. The source of n-type transistor 30 is connected to the reference potential, while its control gate receives the signal PGMEXT#. When PGMEXT# is high, junction 28 is forced to the reference potential.

Junction 32 between p-type transistor 26 and n-type transistor 28 is connected to the gates of p-type transistor 22 and n-type transistor 24, and is connected, via gating n-type transistor 34, to n-type transistors 36, 38, 40 and 42, which are connected to form an OR type function. The drains of n-type transistors 36, 38, 40 and 42, are connected together and to the source of transistor 34; and their sources are connected to the reference potential. The control gates of n-type transistors 36, 38, 40 and 42, are connected to word lines WL<1>, WL<3>, WL<4>, and WL<6>, respectively, such that a high level received on any of these word lines when PRGST is high will result in junction 32 being forced low. The gating function of n-type transistor 34 is controlled by the program start signal, PRGST. Transistor sizes are provided in the following table for one embodiment of the latch circuitry 20 of FIG. 2.

| Transistor | Size | Transistor | Size |
|---|---|---|---|
| 22 | 4/1.4 | 30 | 10/1.4 |
| 24 | 10/1.34 | 34 | 4.3/1.4 |
| 26 | 2.2/7.23 | 36, 38, 40, 42 | 3.6/1.4 |
| 28 | 3.9/1.48 | | |

During a programming operation for the array of FIG. 1, certain of the non-volatile memory cells may be selected for programming. For the non-volatile memory cells of the type disclosed in the abovementioned U.S. Pat. No. 5,289,411, programming of a cell is accomplished by applying a program voltage to the source, an intermediate voltage, such as 2V, to the gate, and a low voltage or 0V to the drain. Thus, in the arrangement of FIG. 1, the latch 20 associated with the shared source line for the cell to be programmed is initially set high, to thereby supply the programming voltage (Vep) to the source line; and the corresponding bit line and word line are set to the voltages required for programming. In one embodiment, all of the word lines for the sector which contains the cell to be programmed (the selected sector) are brought high in order to set the associated SL HV latch 20. The bit lines associated with the unselected cells are pre-charged or pulled up to a high level in order to inhibit programming of the unselected cells.

It has been discovered that under the above conditions, coupling (parasitic, capacitive or otherwise) between the bit lines, word lines and source lines can cause noise and or signals to be coupled onto unintended conductive regions, such as the source lines for unselected cells. In turn, the coupled signals can be high enough to cause the latches associated with those source lines to be inadvertently set to a programming state, even though they were intended to be in a no-programming state. This can cause excessive loading on the programming signal sources such that the programming signal sources are unable to provide sufficient voltage or current levels for programming the intended (selected) cells.

In FIG. 1, this coupling is depicted for one bit line, word line and source line grouping—BL<k>, WL<0> and SL<0>. $C_{BLWL}$, represents the coupling between bit line BL<k> and word line WL<0>; $C_{WLSL}$, represents coupling between word line WL<0> and source line SL<0>; and $C_{BLSL}$, represents coupling between bit line BL<k> and source line SL<0>. Furthermore, arrow 18 represents conductive coupling of the bit line and the source line through the non-volatile storage cell which can occur when a voltage is applied to the gate of the cell. It is to be understood that similar coupling relationships exist for other bit line, word line and source line groupings.

When the unselected bit lines are precharged to a high level, such as Vcc, in order to inhibit programming in cells connected to those bit lines, the word lines (for the selected as well as unselected cells) can be coupled up to a high level through $C_{BLWL}$; the source line can be coupled up to a high level through $C_{BLSL}$; and the source line also can be coupled up to a high level through $C_{WLSL}$ by way of the word line being coupled up to a high level. Increasing levels on the source line can also cause the word line to be coupled to a high level through $C_{WLSL}$.

Further, when the word lines of a selected sector are high, a conductive path can be formed through the memory cells from bit line to source line that can cause the source line to go high, and possibly set the latch 20 inadvertently or prematurely. A worst case scenario can occur when all cells are erased so that a fairly low voltage on the word lines can cause the cells to be conductive.

Figure 6:
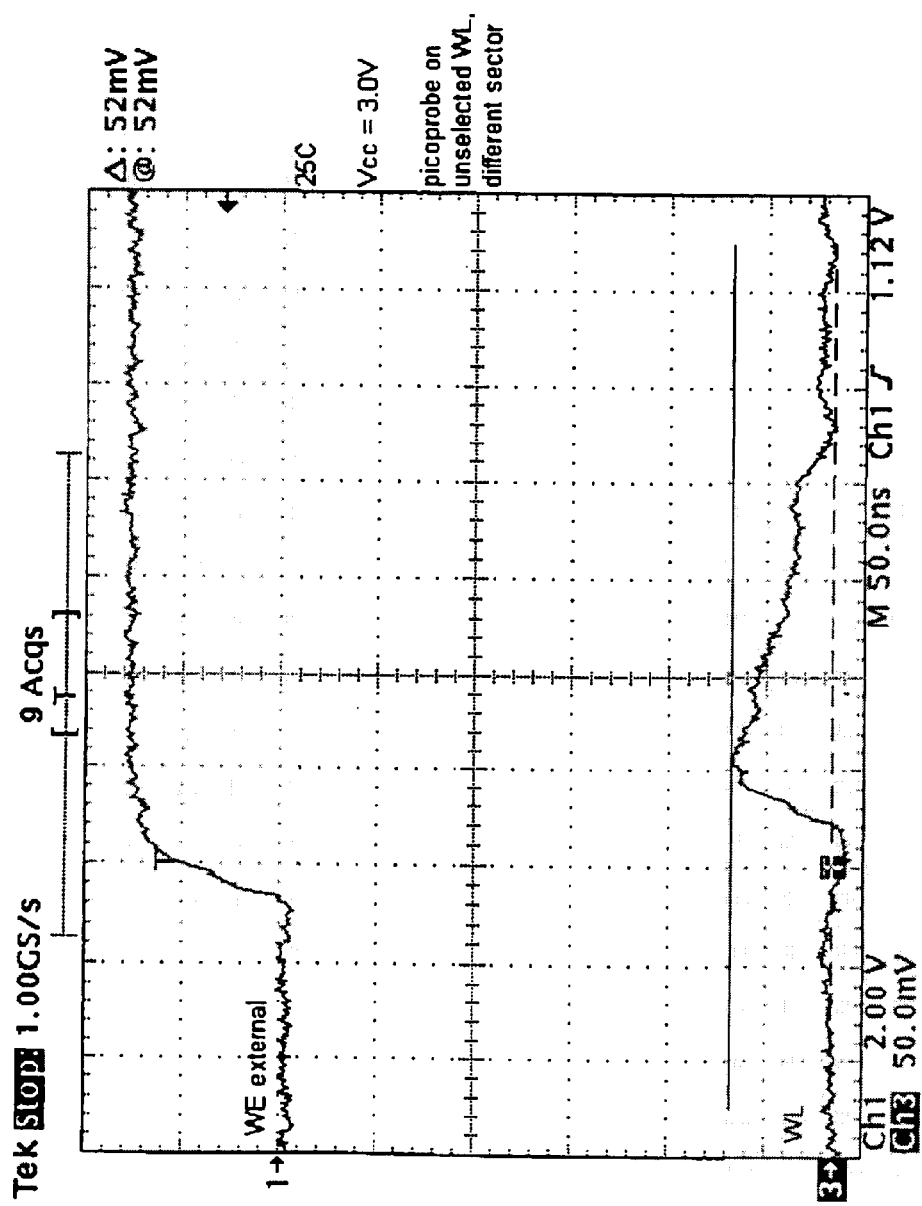
FIG. 6 is a reproduction of the results of an internal picoprobe experiment run on an actual device, illustrating coupling effects on an unselected word line in a different sector during a programming operation.

FIG. 3 illustrates the timing and signal magnitudes associated with a programming operation for the array configuration of FIGS. 1 and 2. The signal PROG goes high during the programming operation. PROGI represents a program initialize period (approximately between $t_0$ and $t_2$) during which the unselected bit lines BL are precharged to a high voltage, e.g. Vcc or a program inhibit level. The third waveform represents the unselected bit lines and illustrates their precharging during the program initialize period, where the level Vcc is reached around time $t_1$. The fourth waveform referenced with the notation "noise/coupling (WL's)" is an example of the signals that may be coupled onto the word lines WL and source lines during the bit line precharging period. FIG. 6 provides experimental result showing coupling of signals onto an unselected word line in a device having the features of the array and circuitry illustrated in FIGS. 1 through 3.

The trace in FIG. 3, labeled PGMEXT#, operates like a latch reset signal which keeps the output of latch 20 low while PGMEXT# is in a high state. Thus, it can be seen in FIG. 3 that PGMEXT# goes low at the start of the precharging of the unselected bit lines. It can also be seen that the transition of PGMXT# from high to low results in the latch enable signal, PRGST, transitioning from low to high. When latch enable signal PRGST goes high, the states of the word lines WL's are permitted to control the state of latch 20. As can be seen from FIG. 2, when PRGST is high, gate 34 connects junction 32 to the drains of transistors 36, 38, 40 and 42. If any of word lines WL<1>, WL<3>, WL<4>, or WL<6> are high, junction 32 will be driven toward the reference potential, which may result in the setting of latch 20 to provide a potential of approximately VSHV on junction 28.

The next to last waveform in FIG. 3 illustrates the levels on the word lines of the selected sector during the program initiation period, which are used to set latch 20 to output the program potential on the associated source line. It is to be noted that this waveform transitions from low to high shortly after PRGST transitions from low to high, and then transitions from high to low at time $t_2$, the end of the PROGI precharge interval The last waveform illustrates the signal level on the word line WL(n) for the row in which the cell selected for programming is located. Thus, it can be seen that after the precharging of the bit lines for the unselected cells, the word line for the selected cell is brought to VPWL, a programming voltage which, in cooperation with the voltages on the associated bit line and source line, will program it.

In one physical configuration of the array of FIG. 1 it was found that fast pull-up/precharge voltages on the unselected bit lines caused the unselected word lines and source lines to be coupled up to levels (for example, greater than 0.7V to 0.8V on the word lines) which caused accidental setting of the associated SL HV Latch Driver which was previously unset. As can be appreciated from an inspection of the latch circuit of FIG. 2, voltages of 0.7V to 0.8V, or greater, on WL<1>, WL<3>, WL<4>, or WL<6>, and/or SL, can cause the latch to be set so that SL is latched high. FIG. 6 presents experimental results illustrating the coupling effect on an unselected word line.

In the embodiment of FIGS. 1 and 2, latches 20 are used to provide a sector-by-sector control over the application of the programming voltage VSHV to the source lines of selected cells. Namely, each sector has its own latch 20 which if set high will supply VSHV to the source lines SL for that sector. In this manner, the loading on the circuitry that generates VSHV can be better controlled. However, as can be appreciated, if enough unselected latches 20 are caused to be accidentally set by the above described coupling effects during the bit line precharging phase of a programming operation, there can be an overloading of the VSHV generating circuitry such that the level of VSHV is lowered to a point where it is insufficient for the programming operation. The effect can be severe enough to cause failure of the part, under some circumstances. It is to be understood, that while the above described coupling effects have been illustrated in the context of a particular non-volatile memory cell, array architecture, latch circuit and operation, other types of non-volatile memory cells, array architectures and/or latch circuits and operation can be affected as well.

Figure 4:
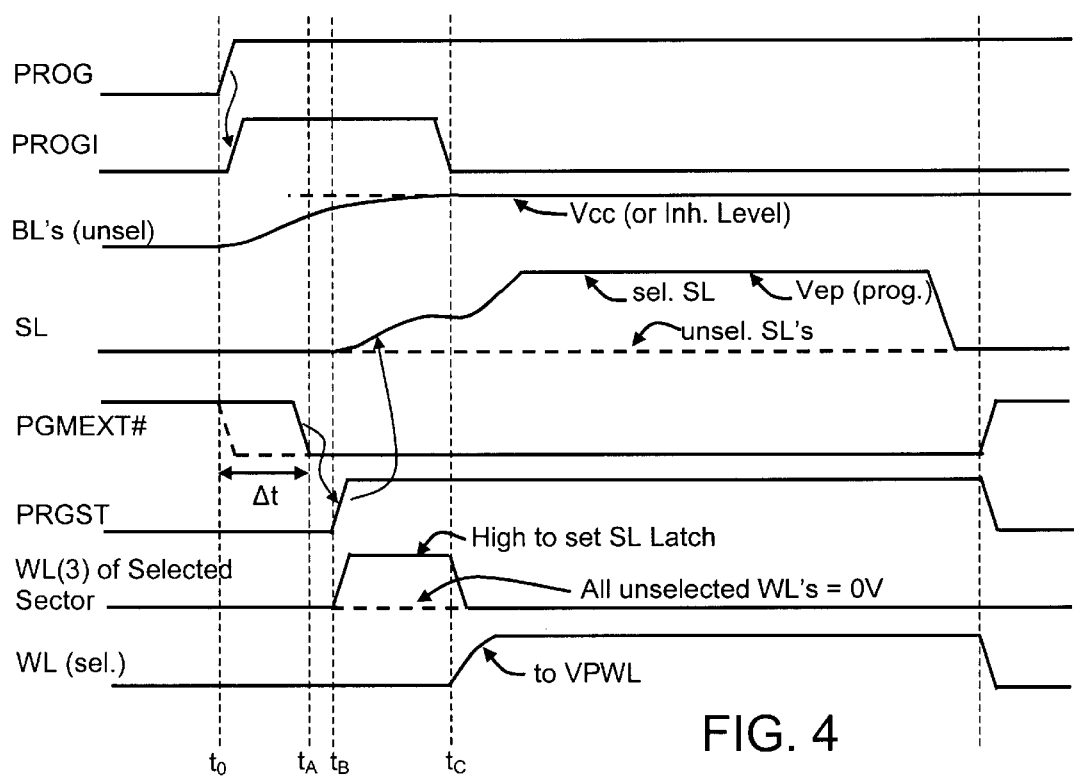
FIG. 4 is a timing diagram illustrating a programming operation in accordance with the present invention that has been modified to counteract noise/coupling effects.
Figure 5:
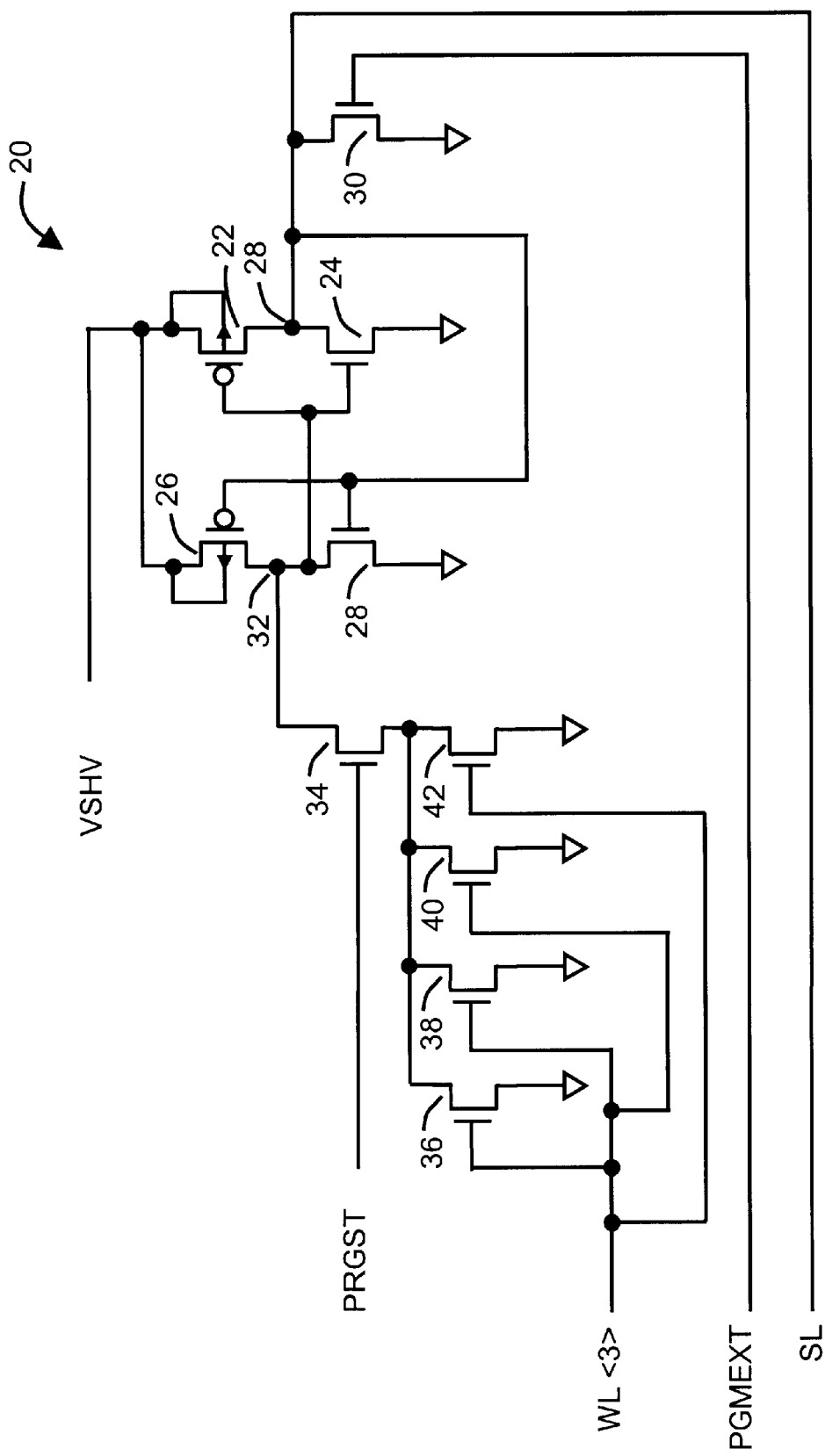
FIG. 5 is a simplified schematic diagram of the temporary storage circuit of FIG. 2 that has been modified to counteract noise/coupling effects in accordance with the present invention.

In accordance with the present invention, the above effects can be reduced through a number of modifications to the device design and operation. These modifications include minimizing the resistive (conductive) path from the bit lines (which are set high) to the source lines by selecting fewer, for example, only one (1), word lines in a selected sector to set the latch 20 for that sector. This reduces the number of non-volatile memory cells which might be caused to conduct and form resistive (conductive) paths between precharged bit lines and source line(s), which in turn can cause the source line(s) to be unintentionally or prematurely charged to a high voltage. This modification can be seen in the timing diagrams of FIG. 4 where the next to last waveform shows that only one word line, WL(3), provides a high level during the bit line precharge period, and with all other word lines for the selected sector and all unselected word lines remaining at a low level. FIG. 5 illustrates the effective latch circuit in which this modification is implemented. In effect, n-type transistors 36, 38, 40 and 42 are controlled by the signal level on a single word line, WL<3>.

Another modification in accordance with the present invention is directed toward inhibiting the latching operation of the latches 20 in SL HV Latch/Driver 16 during the initial precharging of the unselected bit lines. Thus, for the latch circuit 20 of FIG. 2, this can be implemented by keeping the source lines at the reference potential and the latch enable signal, PRGST, low during this period. Thus, in FIG. 4, it can be seen that the waveform PRGST is low during the period when waveform PROGI is high until about time $t_B$; and it can be seen that waveform PGMEXT# does not transition from high to low until time $t_A$, a period of approximately $\Delta t$ following the start of the precharging of the unselected bit lines. In one embodiment, $\Delta t=100$ nsec to 200 nsec. It will be recalled that the signal PGEXT# controls n-type transistor 30, such that while PGEXT# is high, n-type transistor 30 keeps junction 38 of the latch 20 at the reference potential. Thus, even if voltages are coupled to the source line by the above described coupling effects, n-type transistor will continue to discharge source line 30 until PGMEXT# goes low. In this manner, latch 20 is disabled during the initial portion of the bit line precharge period which is the time when the heaviest coupling occurs. From FIG. 4 it can be seen that by time $t_B$, the voltage on the precharged unselected bit lines has substantially reached the intended Vcc or inhibit level.

A further modification in accordance with the present invention is to minimize the coupling effect from bit lines to word lines and source lines by controlling the ramp rate of the precharging of the bit lines. This can be seen in the bit line precharge waveform of FIG. 4 which has a more gradual rate of change and in which the ultimate precharge level of Vcc is not reached until just before the end of the high state of PROGI. In contrast, in the corresponding waveform of FIG. 3 the Vcc state is reached about half-way through the period during which PROGI is in a high state. For example, if the rate of precharge in FIG. 3 is 1V per 100 nsec, the rate of precharge according to the modification in accordance with the present invention should be approximately 0.75V per 100 ns or slower.

Therefore, in accordance with the present invention, the above described coupling effects can be mitigated through one or a combination of measures including minimizing the resistive (conductive) path from bit lines to source lines by limiting the number of word lines of the selected sector which are used to set any latches or storage circuits during the precharge periods; inhibit activation of any latches or storage circuits during the initial portion of the precharging phase of the unselected bit lines; and/or minimize the coupling effect from bit lines to word lines and source lines by controlling the ramp rate of the bit line precharge. In the array example described herein these measures would include minimizing the resistive (conductive) path from bit lines to source lines by selecting only one word line, for example, of the selected sector during the PROGI (program initialize) period; inhibit latching of the source line high voltage latch/driver during the initial portion of the precharging phase of the unselected bit lines by keeping the source lines at a reference level, such as ground, and the latch-enable signal (PRGST) low; and/or minimize the coupling effect from bit lines to word lines and source lines by controlling the ramp rate of the bit line precharge so that the bit lines reach the precharge level, for example Vcc, in approximately the PROGI period.

Those skilled in the art will recognize that while the present invention has been described in the context of a specific array architecture and non-volatile memory cell structure, the principals taught in accordance with the present invention are applicable to other array architectures and memory cells where the above described coupling effects are present.

The terms and expressions which have been employed herein are intended as terms of description and not of limitation, and there is no intent in the use of such terms and expressions of excluding equivalents of the features shown and described, or portions thereof, it being recognized that various modifications are possible within the scope of the invention claimed.

What is claimed is:

1. A method for programming non-volatile memory cells in an array of the type which includes a plurality of bit lines, a plurality of word lines, and a plurality of source lines, and a plurality of temporary storage circuits which can be set to supply a desired state for use in connection with operations involving designated non-volatile memory cells, wherein each of the plurality of temporary storage circuits communicates with a different one of a plurality of groupings of the non-volatile memory cells by way of associated word and source lines, the method comprising the steps of precharging unselected bit lines to a program inhibit level, as a part of a programming operation;

inhibiting the operation of the plurality of temporary storage circuits during a first portion of the precharging step; and setting ones of the plurality of temporary storage circuits to desired states following the first portion of the precharging step.

2. The method of claim 1, wherein the temporary storage circuits are set to a program state in response to an enable signal, and further wherein the inhibiting step includes the steps of setting the source lines at a reference potential during an initial portion of the precharging step; and withholding the enable signal from the temporary storage circuits during the initial portion of the precharging step.

3. The method of claim 1, wherein the withholding step includes the step of applying a disable signal to the temporary storage circuits during the initial portion of the precharging step.

4. A method for programming non-volatile memory cells in an array of the type which includes a plurality of bit lines, a plurality of word lines, and a plurality of source lines, and a plurality of temporary storage circuits which can be set to supply a desired state for use in connection with operations involving designated non-volatile memory cells, wherein each of the plurality of temporary storage circuits communicates with a different one of a plurality of groupings of the non-volatile memory cells by way of associated word and source lines, the method comprising the steps of precharging unselected bit lines to a program inhibit level, at a rate which is selected to reduce coupling effects between the unselected bits lines and word lines or source lines, as a part of a programming operation; and programming selected non-volatile memory cells according to states set in the plurality of temporary storage circuits.

5. The method of claim 4 wherein the step of precharging the bit lines to a program inhibit level includes the step of adjusting the rate of the precharging so that the bit lines reach the program inhibit level in approximately a program initialize period.

6. A method for programming non-volatile memory cells in a selected sector of an array of the type which includes a plurality of bit lines, a plurality of word lines, and a plurality of source lines, and a plurality of temporary storage circuits which can be set to supply a desired state for use in connection with operations involving designated non-volatile memory cells, wherein each of the plurality of temporary storage circuits communicates with a different one of a plurality of groupings of the non-volatile memory cells by way of associated word and source lines, the method comprising the steps of arranging each of the plurality of temporary storage circuits to be responsive to a minimum number of word lines associated with the selected sector during a period in which unselected bit lines are precharged;

precharging unselected bit lines to a program inhibit level, as a part of a programming operation; and programming selected non-volatile memory cells.

7. The method of claim 6 wherein the arranging step includes the step of arranging each of the plurality of temporary storage circuits to be responsive to only one word line of the associated selected sector during the period in which the unselected bit lines are precharged.

8. A method for programming non-volatile memory cells in an array of the type which includes a plurality of bit lines, a plurality of word lines, and a plurality of source lines, and a plurality of temporary storage circuits which can be set to supply a desired state for use in connection with operations involving designated non-volatile memory cells, wherein each of the plurality of temporary storage circuits communicates with a different one of a plurality of groupings of the non-volatile memory cells by way of associated word and source lines, the method comprising the steps of precharging unselected bit lines to a program inhibit level, at a rate which is selected to reduce coupling effects between the unselected bits lines and word lines or source lines, as a part of a programming operation;

inhibiting the operation of the plurality of temporary storage circuits during a first portion of the precharging step;

arranging each of the plurality of temporary storage circuits to be responsive to a minimum number of word lines associated with the selected sector during a period in which unselected bit lines are precharged;

setting ones of the plurality of temporary storage circuits to desired states following the first portion of the precharging step; and programming selected non-volatile memory cells.

9. The method of claim 8, wherein the temporary storage circuits are set to a program state in response to an enable signal, and further wherein the inhibiting step includes the steps of setting the source lines at a reference potential during an initial portion of the precharging step; and withholding the enable signal from the temporary storage circuits during the initial portion of the precharging step.

10. The method of claim 8, wherein the withholding step includes the step of applying a disable signal to the temporary storage circuits during the initial portion of the precharging step.

11. The method of claim 8 wherein the step of precharging the bit lines to a program inhibit level includes the step of adjusting the rate of the precharging so that the bit lines reach the program inhibit level in approximately a program initialize period.

12. The method of claim 8 wherein the arranging step includes the step of arranging each of the plurality of temporary storage circuits to be responsive to only one word line of the associated selected sector during the period in which the unselected bit lines are precharged.

* * * * *